(12) United States Patent
Kim et al.

(10) Patent No.: US 11,342,283 B2
(45) Date of Patent: May 24, 2022

(54) PACKAGE SUBSTRATE AND SEMICONDUCTOR PACKAGE INCLUDING THE SAME

(71) Applicant: SAMSUNG ELECTRONICS CO., LTD., Suwon-si (KR)

(72) Inventors: Byungwook Kim, Suwon-si (KR); Ayoung Kim, Yongin-si (KR); Seongwon Jeong, Seoul (KR); Sangsu Ha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/810,091

(22) Filed: Mar. 5, 2020

(65) Prior Publication Data

US 2021/0050308 A1 Feb. 18, 2021

(30) Foreign Application Priority Data

Aug. 12, 2019 (KR) ........................ 10-2019-0098190

(51) Int. Cl.
  *H01L 23/31* (2006.01)
  *H01L 23/498* (2006.01)
  *H01L 23/00* (2006.01)

(52) U.S. Cl.
  CPC ........ *H01L 23/562* (2013.01); *H01L 23/3157* (2013.01); *H01L 23/49811* (2013.01); *H01L 23/49838* (2013.01); *H01L 24/05* (2013.01); *H01L 24/13* (2013.01); *H01L 2224/0401* (2013.01); *H01L 2924/3512* (2013.01)

(58) Field of Classification Search
  CPC ..................................................... H01L 23/562
  See application file for complete search history.

(56) References Cited

U.S. PATENT DOCUMENTS

| 5,943,597 | A | 8/1999 | Kleffner et al. |
|---|---|---|---|
| 7,663,250 | B2 | 2/2010 | Jeon et al. |
| 7,982,313 | B2 | 7/2011 | Grillberger et al. |
| 8,643,149 | B2 | 2/2014 | Chen |
| 8,742,590 | B2 | 6/2014 | Beyne |
| 9,293,531 | B2 | 3/2016 | Faist et al. |
| 9,337,096 | B2 | 5/2016 | Wang et al. |
| 9,935,046 | B1 * | 4/2018 | Hung ................ H01L 23/3114 |
| 2013/0154112 | A1 | 6/2013 | Zhang et al. |

FOREIGN PATENT DOCUMENTS

KR  10-0979497 B1  9/2010

\* cited by examiner

*Primary Examiner* — William A Harriston
(74) *Attorney, Agent, or Firm* — Sughrue Mion, PLLC

(57) ABSTRACT

Provided a package substrate including an insulation substrate, a conductive layer provided in the insulation substrate, upper pads provided on an upper surface of the insulation substrate and electrically connected to the conductive layer, lower pads provided on a lower surface of the insulation substrate and electrically connected to the conductive layer, and at least one trench provided at a portion of the insulation substrate adjacent to at least one of the upper pads and configured to block stress, which is generated by an expansion of the insulation substrate, from spreading to the at least one of the upper pads.

15 Claims, 21 Drawing Sheets

PACKAGE SUBSTRATE AND SEMICONDUCTOR PACKAGE INCLUDING THE SAME

CROSS-REFERENCE TO THE RELATED APPLICATION

This application claims priority from Korean Patent Application No. 10-2019-0098190, filed on Aug. 12, 2019 in the Korean Intellectual Property Office, the disclosure of which is incorporated herein by reference in their entirety.

BACKGROUND

1. Field

Example embodiments relate to a package substrate and a semiconductor package including the same. More particularly, example embodiments relate to a package substrate used for packaging a semiconductor chip, and a semiconductor package including the package substrate.

2. Description of the Related Art

Generally, a semiconductor package may include a package substrate, a semiconductor chip and conductive bumps. The conductive bumps may be interposed between the package substrate and the semiconductor chip to electrically connect the package substrate with the semiconductor chip.

According to related arts, the package substrate may have a coefficient of thermal expansion (CTE) higher than that of the semiconductor substrate. Thus, during the semiconductor packaging, the package substrate may be expanded more than the semiconductor chip. The expansion of the package substrate being greater than that the expansion of the semiconductor chip may result in applying stresses to the conductive bumps and a back end of the line (BEOL) of the semiconductor chip. The stresses may cause cracks in the conductive bumps and the BEOL.

SUMMARY

Example embodiments provide a package substrate that may be capable of reducing stresses to prevent or reduce cracks from being generated in conductive bumps and a BEOL.

Example embodiments also provide a semiconductor package including the above-mentioned package substrate.

According to an aspect of an example embodiment, there is provided a package substrate including an insulation substrate, a conductive layer provided in the insulation substrate, upper pads provided on an upper surface of the insulation substrate and electrically connected to the conductive layer, lower pads provided on a lower surface of the insulation substrate and electrically connected to the conductive layer, and at least one trench provided at a portion of the insulation substrate adjacent to at least one of the upper pads and configured to block stress, which is generated by an expansion of the insulation substrate, from spreading to the at least one of the upper pads.

According to another aspect of an example embodiment, there is provided a package substrate including an insulation substrate, a conductive layer provided in the insulation substrate, upper pads provided on an upper surface of the insulation substrate and electrically connected to the conductive layer, lower pads provided on a lower surface of the insulation substrate and electrically connected to the conductive layer, and trenches provided at portions of the insulation substrate adjacent to corner pads among the upper pads, the corner pads being provided at corners of the insulation substrate in a direction crossing a direction from a central portion of the insulation substrate to the corners of the insulation substrate, a depth of each of the trenches being from 5% to 100% of a depth of the insulation substrate.

According to an aspect of an example embodiment, there is provided a semiconductor package including a semiconductor chip including bump pads, conductive bumps connected to the bump pads, respectively, and a package substrate including an insulation substrate provided under the semiconductor chip, a conductive layer provided in the insulation substrate, upper pads provided on an upper surface of the insulation substrate and electrically connecting the conductive layer with the conductive bumps, lower pads provided on a lower surface of the insulation substrate and electrically connected to the conductive layer, and at least one trench provided at a portion of the insulation substrate adjacent to at least one of the upper pads to block stress, which is generated by an expansion of the insulation substrate, from spreading to the at least one of the upper pads.

BRIEF DESCRIPTION OF THE DRAWINGS

The above and/or other objects and will become apparent by describing in detail example embodiments thereof with reference to the accompanying drawings, of which.

DETAILED DESCRIPTION OF THE EMBODIMENTS

Hereinafter, example embodiments will be explained in detail with reference to the accompanying drawings.

It will be understood that when an element or layer is referred to as being arranged "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Figure 1:
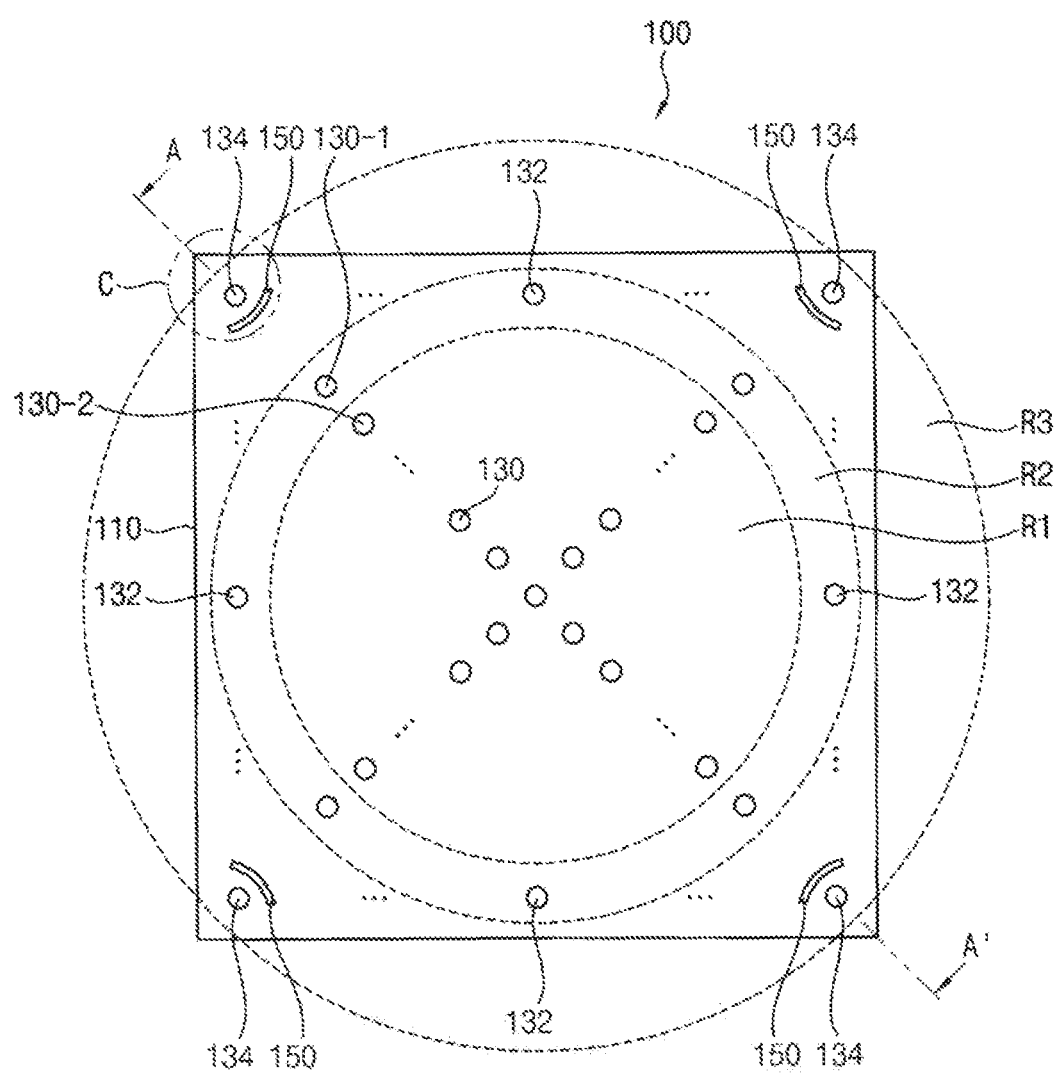
FIG. 1 is a plan view illustrating a package substrate in accordance with example embodiments.
Figure 2:
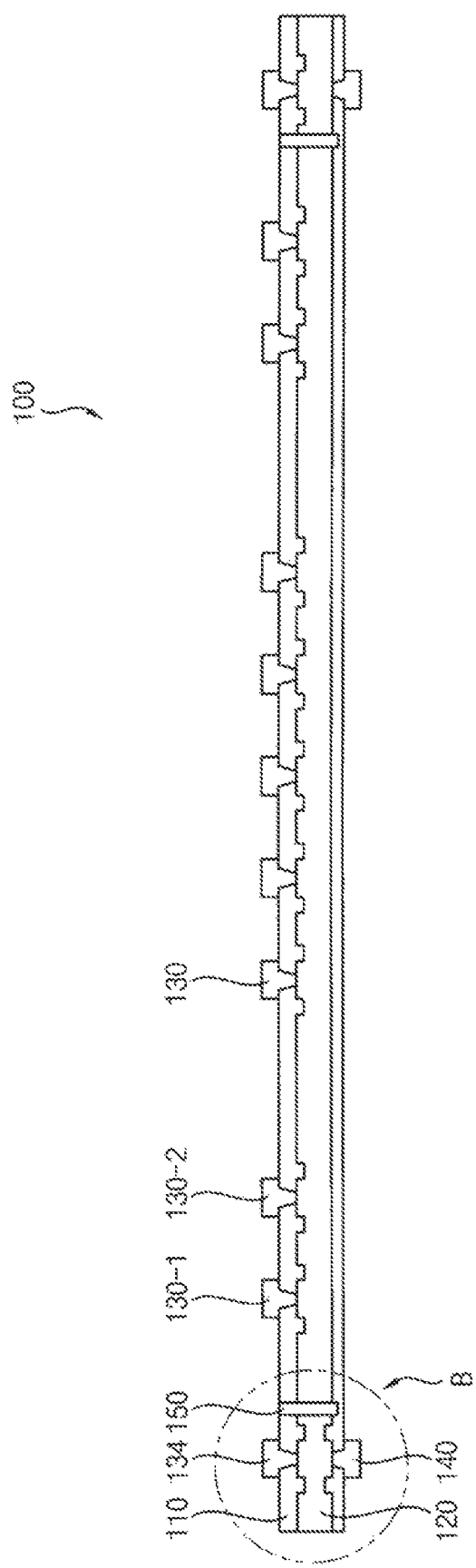
FIG. 2 is a cross-sectional view taken along a line A-A' in FIG. 1.
Figure 3:
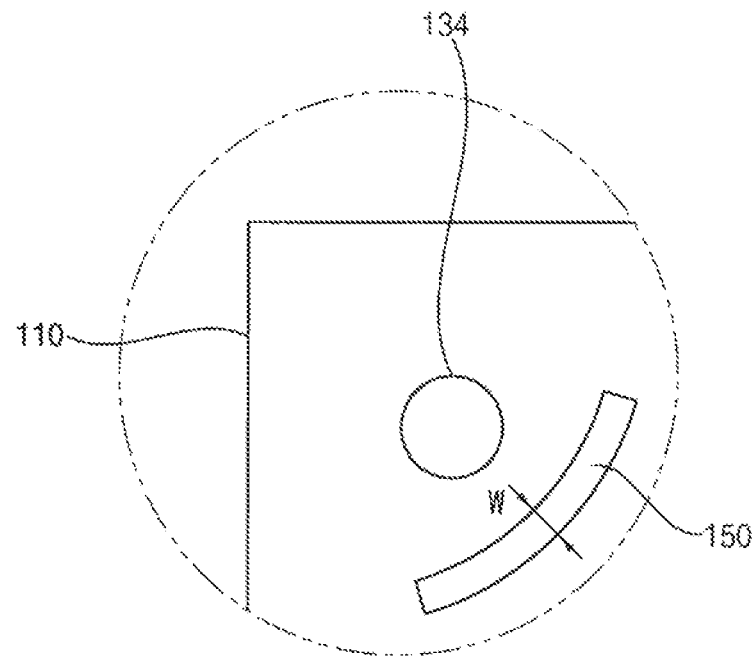
FIG. 3 is an enlarged cross-sectional view of a portion B in FIG. 2.
Figure 4:
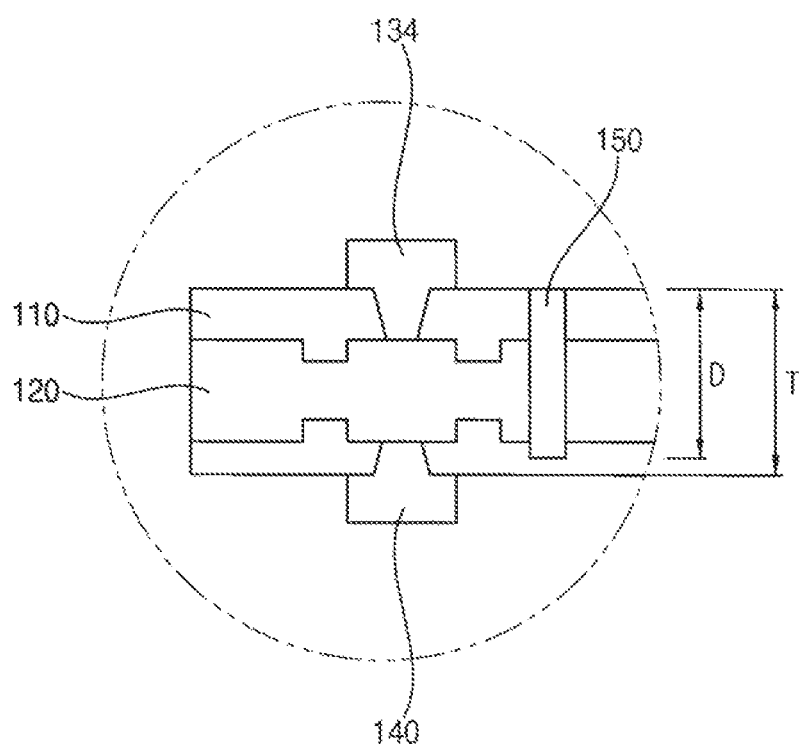
FIG. 4 is an enlarged cross-sectional view of a portion C in FIG. 1.

FIG. 1 is a plan view illustrating a package substrate in accordance with example embodiments, FIG. 2 is a cross-sectional view taken along a line A-A' in FIG. 1, FIG. 3 is an enlarged cross-sectional view of a portion B in FIG. 2, and FIG. 4 is an enlarged cross-sectional view of a portion C in FIG. 1.

Referring to FIGS. 1 to 4, a package substrate 100 of example embodiments may include an insulation substrate 110, a conductive layer 120, a plurality of upper pads 130, 131 and 134 and a plurality of lower pads 140.

The insulation substrate 110 may be arranged under a semiconductor chip electrically connected with the package substrate 100 via conductive bumps. The insulation substrate 110 may have a square shape. However, embodiments are not limited thereto, and the insulation substrate 110 may have other shapes. The insulation substrate 110 may include an insulation material. The insulation material may not be restricted within a specific material.

The insulation substrate 110 may have a CTE higher than a CTE of the semiconductor chip. Thus, a displacement of the insulation substrate 110 by a thermal expansion may be greater than the thermal expansion of the semiconductor chip. For example, the insulation substrate 110 may be expanded or contracted in a radial direction from a central portion of the insulation substrate 110. For example, an expansion direction of the insulation substrate 110 may be a direction from the central portion of the insulation substrate 110 to an edge portion of the insulation substrate 110. Particularly, corners of the insulation substrate 110 may be expanded relatively more than other portions of the insulation substrate 110 in the expansion direction. Therefore, a stress applied to the edge portion, particularly, the corners of the insulation substrate 110 may be higher than a stress applied to the central portion of the insulation substrate 110.

The conductive layer 120 may be formed in the insulation substrate 110. The conductive layer 120 may be exposed through an upper surface and a lower surface of the insulation substrate 110. The conductive layer 120 may include a conductive material such as a metal.

The upper pads 130, 132, and 134 may be arranged on the upper surface of the insulation substrate 110. The upper pads 130, 132, and 134 may be electrically connected to portions of the conductive layer 120 exposed through the upper surface of the insulation substrate 110. The conductive bumps may be mounted on the upper pads 130, 132, and 134. The upper pads 130, 132, and 134 may be arranged spaced apart from each other by a uniform gap in lengthwise and breadthwise directions. However, gaps between the upper pads 130, 132, and 134 may be different from each other.

The lower pads 140 may be arranged on the lower surface of the insulation substrate 110. The lower pads 140 may be electrically connected to portions of the conductive layer 120 exposed through the lower surface of the insulation substrate 110. The lower pads 140 may be arranged spaced apart from each other by a uniform gap the lengthwise and breadthwise directions. However, gaps between the lower pads 140 may be different from each other.

The upper pads 130, 132, and 134 may include central pads 130 arranged on the central portion of the insulation substrate 110, edge pads 132 arranged on edge portions of the insulation substrate 110, and corner pads 134 arranged on the corners of the insulation substrate 110.

Further, the upper pads 130, 132, and 134 may be classified into first pads, second pads and third pads. The first pads may be arranged in a first region R1 defined by a circular shaped area with a first radius from the center of the insulation substrate 110. The second pads may be arranged in a second region R2 defined by a ring shaped area between a second radius longer than the first radius and the first radius surrounding the first region R1. The third pads may be arranged in a third region R3 defined by an area between the second radius and the third radius which is longer than the second radius surrounding the second region R2. The corners pads 134 may correspond to the third pads in the third region R3. Central pads 130-1 located on a diagonal line of the insulation substrate 110 among the edge pads 132 and the central pads 130 adjacent to the corner pad 134 may correspond to the second pads in the second region R2. Remaining central pads 130 except for the central pads 130-1 adjacent to the corner pad 134 may correspond to the first pads in the first region R1. In example embodiments, the insulation substrate 110 may be divided into the three regions. However, embodiments are not limited thereto, and the insulation substrate 110 may be divided into two regions or four or more regions. Therefore, the upper pads 130, 132 and 134 may also be classified into two pads or four or more pads.

As mentioned above, because the highest stress may be applied to the corner of the insulation substrate 110 in the expansion direction, the highest stress may be applied to the conductive bumps on the corners pads 134 compared to the conductive bumps on other upper pads. Thus, a tensile stress and a compressive stress may be applied to the conductive bumps on the corner pads 134 in the expansion direction. The tensile stress and the compressive stress may result in generating cracks in the conductive bumps on the corners pads 134 and a BEOL of the semiconductor chip connected to the conductive bumps.

In order to prevent or reduce the generations of the cracks in the conductive bumps and the BEOL, the package substrate 100 may include at least one trench 150. In example embodiments, the trench 150 may be arranged at the corners of the insulation substrate 110. The trenches 150 may be vertically formed at the corners of the insulation substrate 110 from the upper surface of the insulation substrate 110 to the lower surface of the insulation substrate 110. Each of the trenches 150 may be adjacent to the corner pad 134. The trench 150 may be configured to partially surround the corner pad 134. For example, the trench 150 may be formed at a portion of the corner of the insulation substrate 110 adjacent to the corner pad 134 oriented toward the central portion of the insulation substrate 110. The trench 150 positioned in the third region R3 may correspond to a third trench.

In example embodiments, the trench 150 may be extended in a direction crossing the expansion direction of the insulation substrate 110. Thus, the corner portion of the insulation substrate 110 may be partially divided by the trench 150 to block the stress spreading in the expansion direction to reduce the stress applied to the corners of the insulation substrate 110. As a result, the generations of the cracks in the conductive bumps on the corner pads 134 and the BEOL of the semiconductor chip caused by the stresses may also be prevented or reduced.

In example embodiments, the trench 150 may have an arc shape configured to surround the corner pad 134. As illustrated in FIGS. 3 and 4, the arc-shaped trench 150 may have a depth D and a width W. The depth D of the trench 150 may be less than a thickness of the insulation substrate 110. The depth of the trench 150 may be greater than or equal to about 5% of the thickness of the insulation substrate 110. Further, the width W of the trench 150 may be uniform. The width W of the trench 150 may be greater than or equal to about 10 μm. However, the width W of the trench 150 may be changed in accordance with pitches between bumps pads of the semiconductor chip to which the package substrate 100 may be applied. The trench 150 may have other shapes as well as the arc shape. For example, the trench 150 may have a linear shape configured to cross the expansion direction of the insulation substrate 110.

Figure 5:
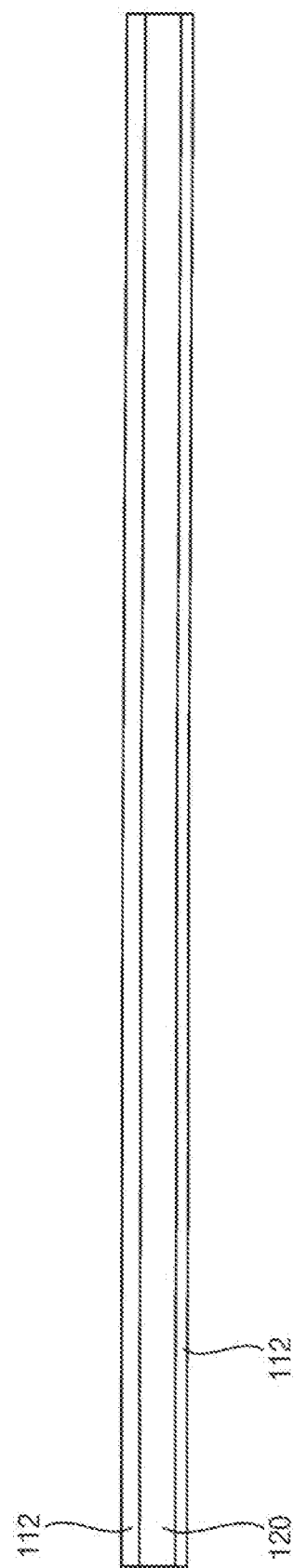
FIGS. 5, 6, and 7 are cross-sectional views illustrating a method of manufacturing the package substrate in FIG. 2.
Figure 6:
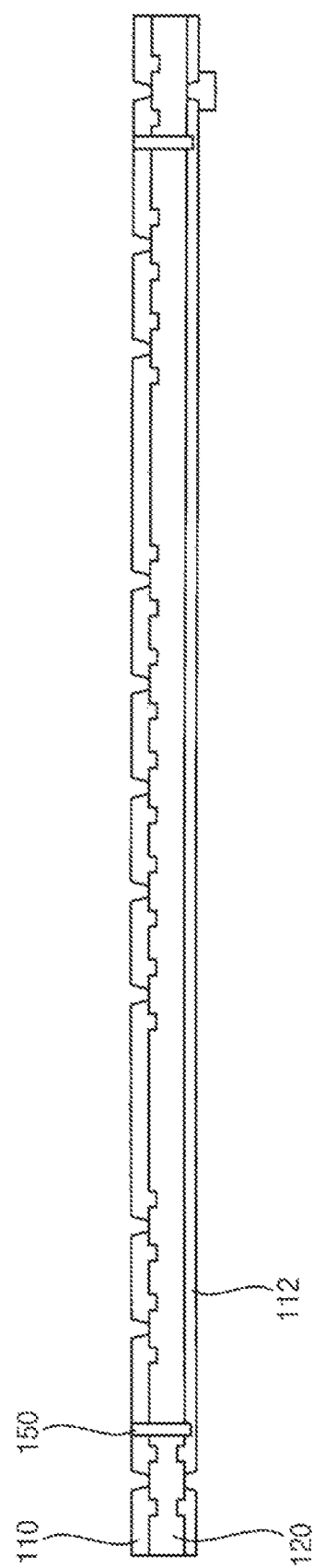
Figure 7:
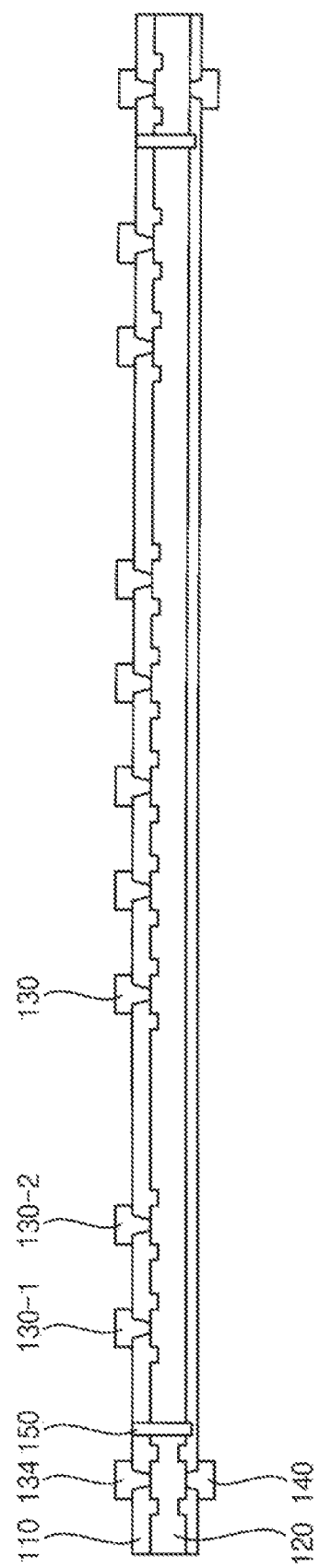

FIGS. 5, 6, and 7 are cross-sectional views illustrating a method of manufacturing the package substrate in FIG. 2.

Referring to FIG. 5, an insulation layer 112 may be formed on an upper surface and a lower surface of the conductive layer 120.

Referring to FIG. 6, the insulation layer 112 may be partially removed by a laser drilling process to form the trench 150. Openings may be formed through the insulation layer 112 to partially expose the upper surface and the lower surface of the conductive layer 120.

Referring to FIG. 7, the upper pads 130, 132, and 134 may be formed on the upper surface and the lower surface of the conductive layer 120 exposed through the openings by a plating process.

Alternatively, after forming the upper pads 130, 132, and 134 and the lower pads 140, the trench 150 may be formed at the insulation layer 112 by the laser drilling process.

Figure 8:
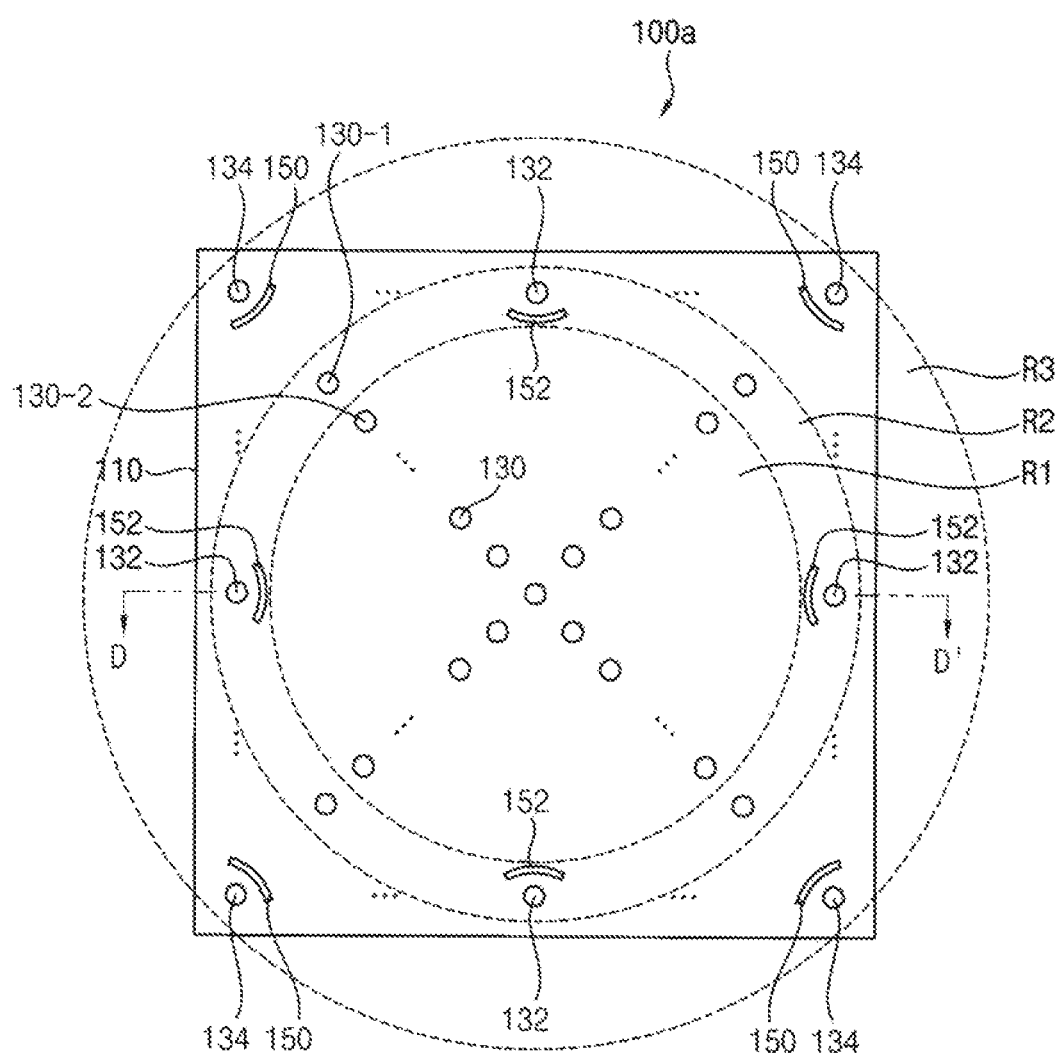
FIG. 8 is a plan view illustrating a package substrate in accordance with example embodiments.
Figure 9:
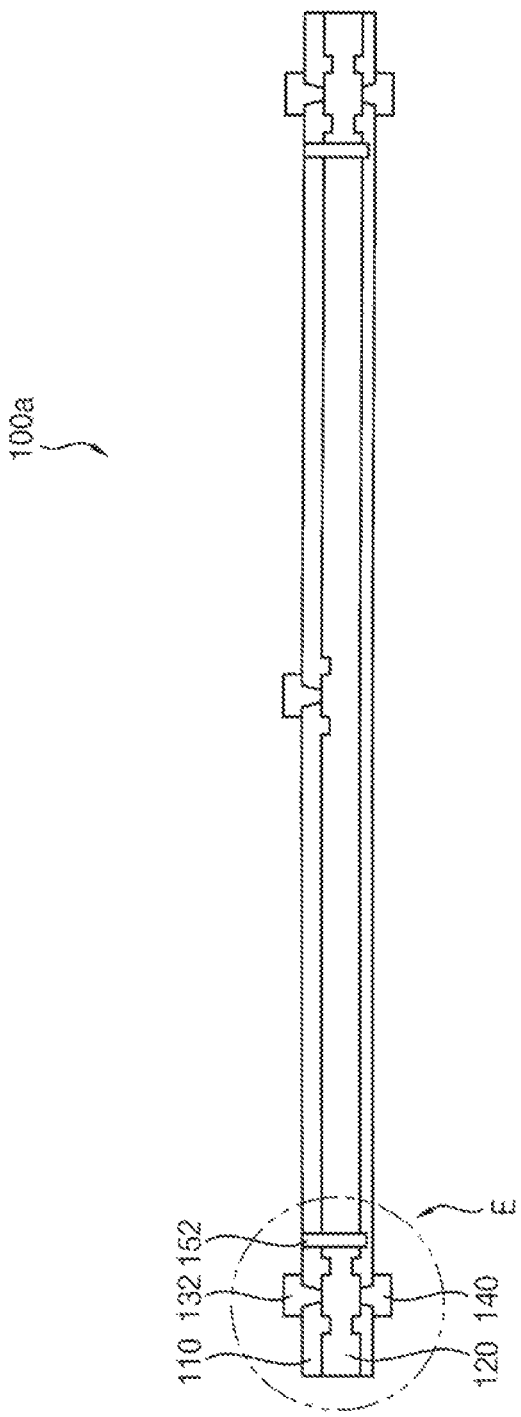
FIG. 9 is a cross-sectional view taken along a line D-D' in FIG. 8.
Figure 10:
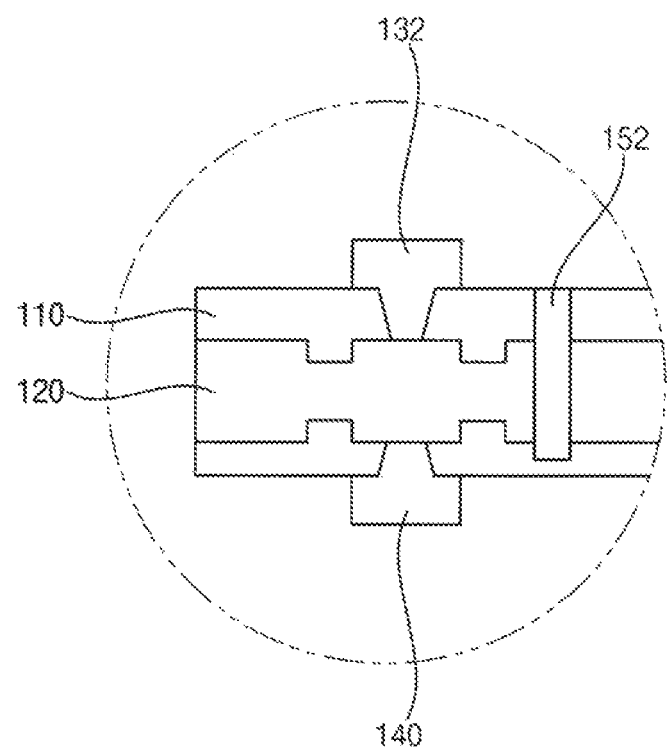
FIG. 10 is an enlarged cross-sectional view of a portion E in FIG. 9.

FIG. 8 is a plan view illustrating a package substrate in accordance with example embodiments, FIG. 9 is a cross-sectional view taken along a line D-D' in FIG. 8, and FIG. 10 is an enlarged cross-sectional view of a portion E in FIG. 9.

A package substrate 100a of this example embodiment may include elements substantially the same as those of the package substrate 100 in FIG. 1 except for further including trenches 152. Thus, the same reference numerals may refer to the same elements and any further illustrations with respect to the same elements may be omitted herein for brevity.

Referring to FIGS. 8, 9, and 10, the trenches 152 may be arranged at the edge portions corresponding to region R2 of the insulation substrate 110. The trenches 152 may be vertically formed at the edge portions of the insulation substrate 110 from the upper surface to the lower surface of the insulation substrate 110. The trenches 152 may be adjacent to the edge pads 132 to partially surround each of the edge pads 132. For example, the trench 152 may be positioned at the edge portion of the insulation substrate 110 adjacent to the edge pad 132 oriented toward the central portion of the insulation substrate 110. The trench 152 positioned in the second region R2 may correspond to a second trench.

In example embodiments, the trench 152 may have a shape similar to that of the trench 150. Thus, any further illustrations with respect to the shape of the trench 152 may be omitted herein for brevity. As mentioned above, because the stress applied to the edge pad 132 may be weaker than the stress applied to the corner pad 134, the trench 152 may have a width W1 narrower than the width W of the trench 150. As the stress applied to the edge pad 132 may be weaker than the stress applied to the corner pad 134, the trench 152 may sufficiently block the stress applied to the edge pad 132 when the width W1 of the trench 152 is narrower than the width W of the trench 150.

Figure 11:
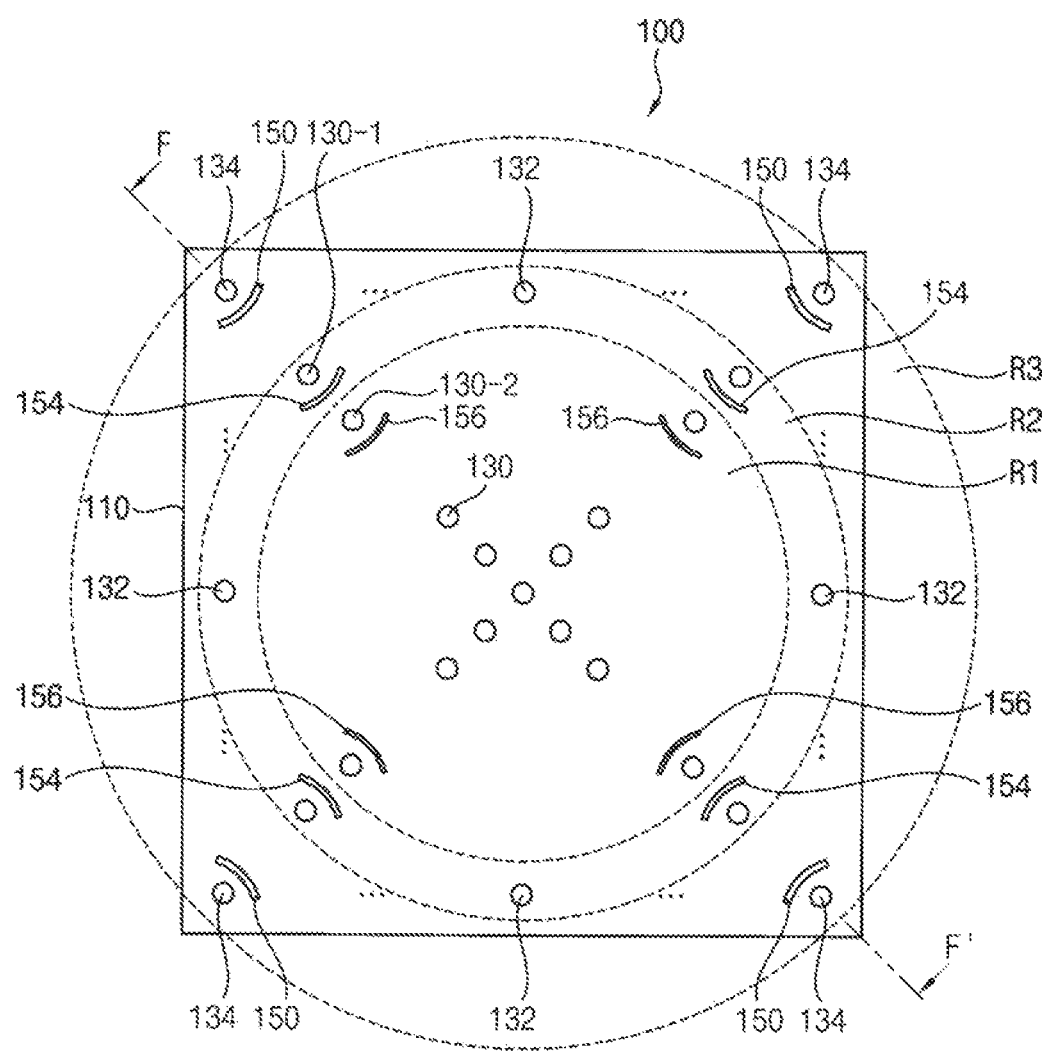
FIG. 11 is a plan view illustrating a package substrate in accordance with example embodiments.
Figure 12:
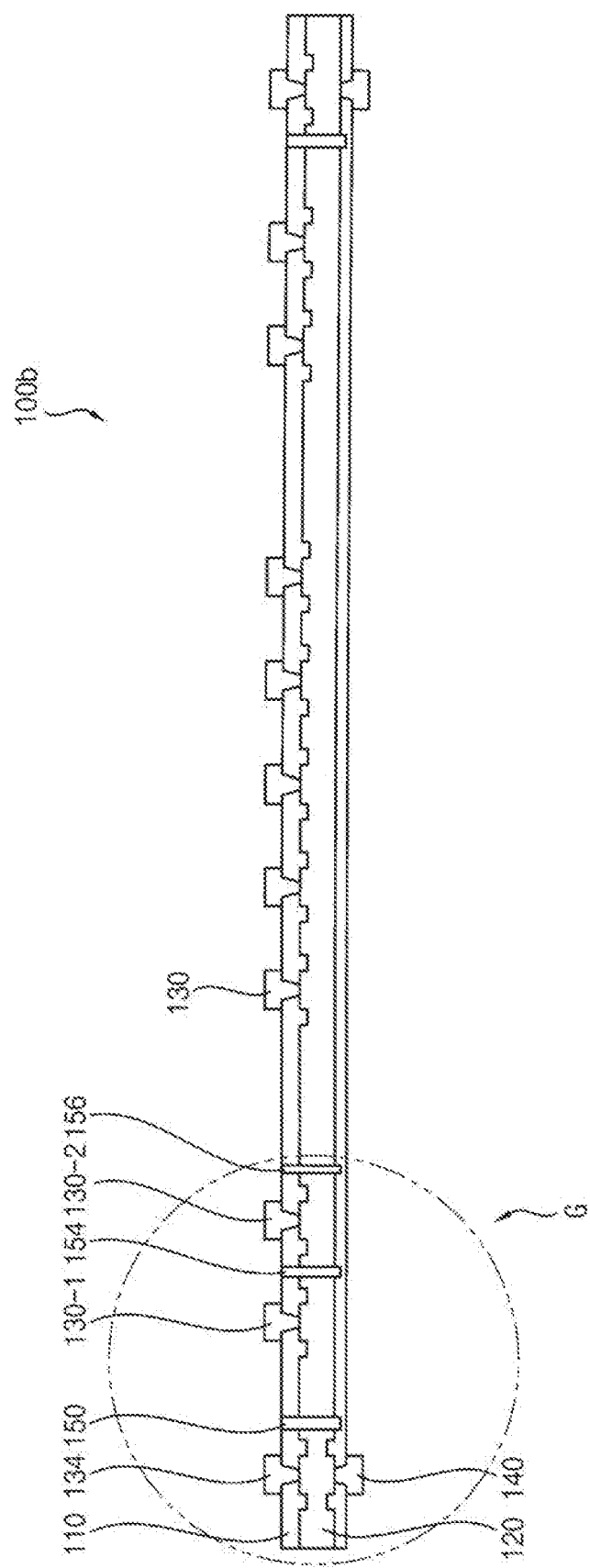
FIG. 12 is a cross-sectional view taken along a line F-F' in FIG. 11.
Figure 13:
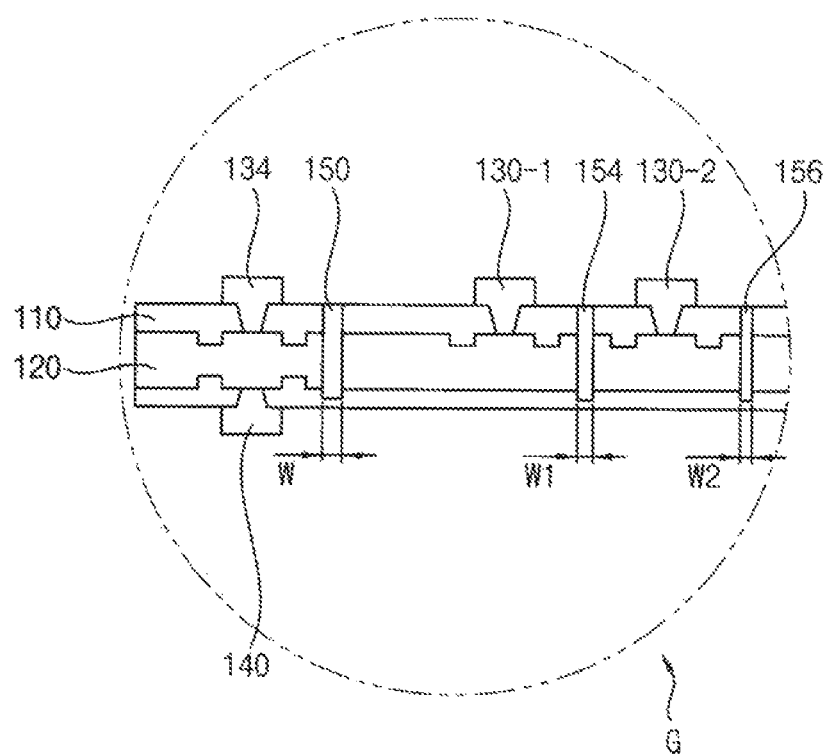
FIG. 13 is an enlarged cross-sectional view of a portion G in FIG. 12.

FIG. 11 is a plan view illustrating a package substrate in accordance with example embodiments, FIG. 12 is a cross-sectional view taken along a line F-F' in FIG. 11, and FIG. 13 is an enlarged cross-sectional view of a portion G in FIG. 12.

A package substrate 100b of this example embodiment may include elements substantially the same as those of the package substrate 100 in FIG. 1 except for further including a first trench 156 and a second trench 154. Thus, the same reference numerals may refer to the same elements and any further illustrations with respect to the same elements may be omitted herein for brevity.

Referring to FIGS. 11, 12, and 13, the second trench 154 may be configured to surround the central pad 130-1 among the central pads 130, which may be located on a diagonal line of the insulation substrate 110, adjacent to the corner pad 134. The first trench 156 may be configured to surround a central pad 130-2 among the central pads 130, which may be located on the diagonal line of the insulation substrate 110, adjacent to the central pad 130-1.

In example embodiments, the first trench 156 and the second trench 154 may have a shape similar to that of the third trench 150 illustrated in FIG. 1 configured to surround the corner pad 134. Thus, any further illustrations with respect to the shape of the first and second trenches 156 and 154 may be omitted herein for brevity. As mentioned above, because the stress applied to the corner pad 134 may be stronger than the stress applied to the central pads 130-1 and 130-2, the second trench 154 may have a width W2 narrower than the width W of the third trench 150. The first trench 156 may have a width W3 narrower than the width W2 of the second trench 154 as illustrated in FIG. 13.

Figure 14:
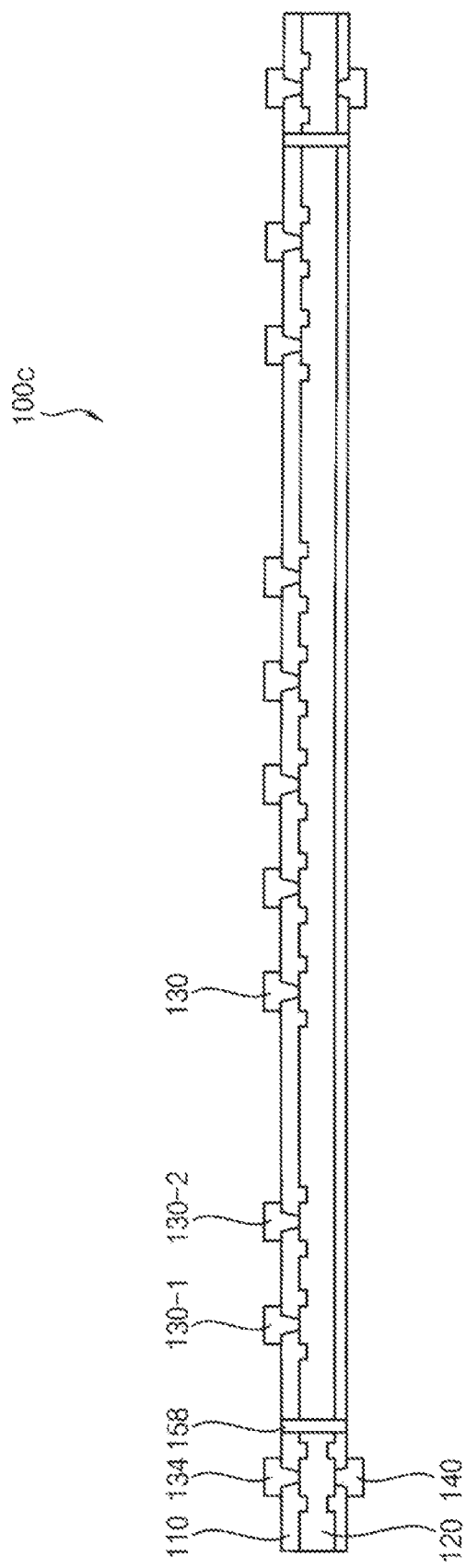
FIG. 14 is a cross-sectional view illustrating a package substrate in accordance with example embodiments.

FIG. 14 is a cross-sectional view illustrating a package substrate in accordance with example embodiments.

A package substrate 100c of this example embodiment may include elements substantially the same as those of the package substrate 100 in FIG. 1 except for a shape of a trench 158. Thus, the same reference numerals may refer to the same elements and any further illustrations with respect to the same elements may be omitted herein for brevity.

Referring to FIG. 14, the trench 158 may be formed from the upper surface of the insulation substrate 110 to the lower surface of the insulation substrate 110. For example, the trench 158 may have a depth D1 substantially the same as the thickness T of the insulation substrate 110. The trench 158 may completely divide the two adjacent portions of the insulation substrate 110 on the expansion direction of the insulation substrate 110 such that the spreading of the stress to the corner pad 134 may be more suppressed.

The shape and the position of the trench 158 except for the depth D1 may be substantially the same as those of the trench 150 in FIG. 1. Thus, any further illustrations with respect to the shape and the position of the trench 158 may be omitted herein for brevity.

Further, the structure of the trench 158 may be applied to the trench 152 in FIG. 8, and the first trench 156 and the second trench 154 in FIG. 11.

Figure 15:
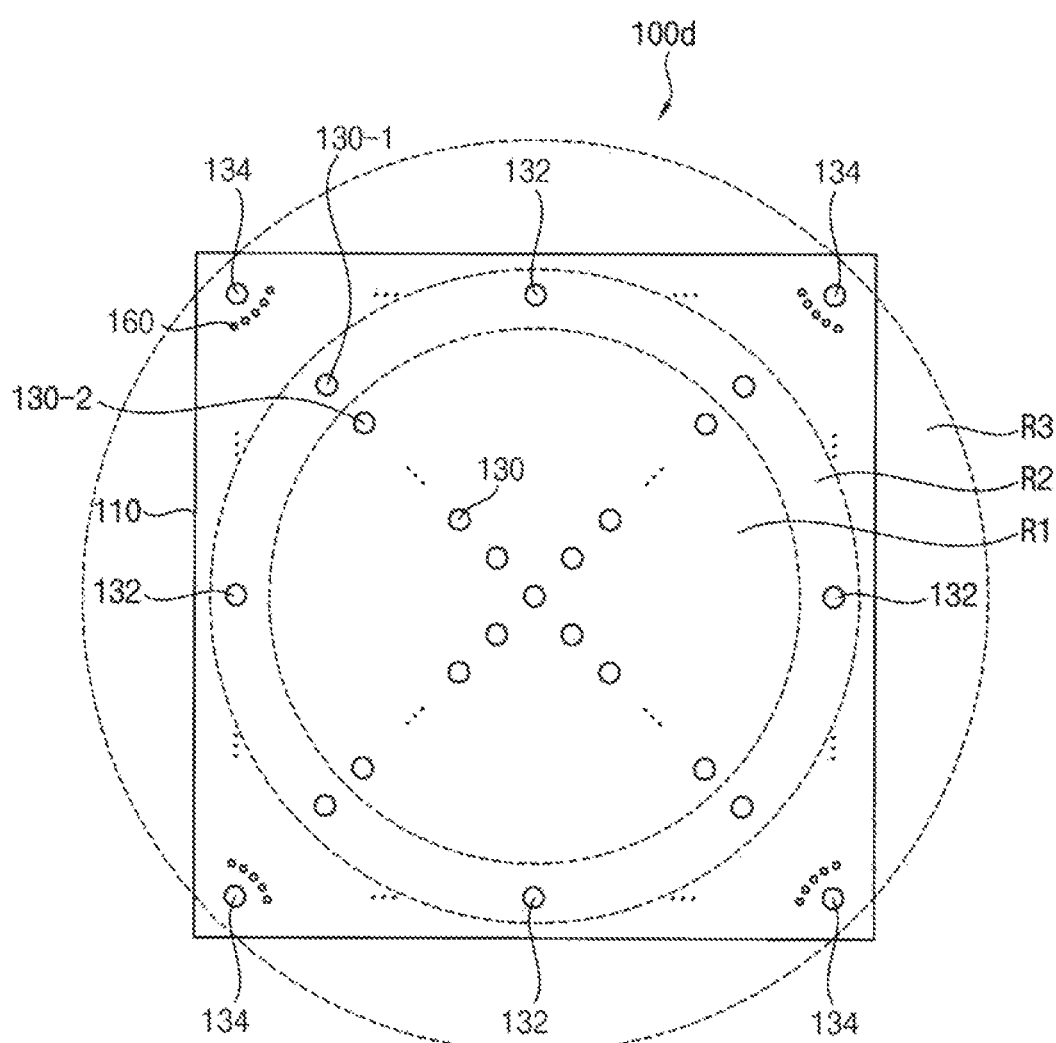
FIG. 15 is a plan view illustrating a package substrate in accordance with example embodiments.

FIG. 15 is a plan view illustrating a package substrate in accordance with example embodiments.

A package substrate 100*d* of this example embodiment may include elements substantially the same as those of the package substrate 100 in FIG. 1 except for a shape of a trench 160. Thus, the same reference numerals may refer to the same elements and any further illustrations with respect to the same elements may be omitted herein for brevity.

Referring to FIG. 15, the trench 160 may have a plurality of dots. The dots may be formed from the upper surface of the insulation substrate 110 to the lower surface of the insulation substrate 110 or before the lower surface of the insulation substrate 110. The depth D2 of the trench 160 may be less than or equal to the depth D of the insulation substrate 110.

The shape and the position of the trench 160 except for the depth D2 may be substantially the same as those of the trench 150 in FIG. 1. Thus, any further illustrations with respect to the shape and the position of the trench 160 may be omitted herein for brevity.

Further, the structure of the trench 160 may be applied to the trench 152 in FIG. 8, and the first trench 156 and the second trench 154 in FIG. 11.

Figure 16:
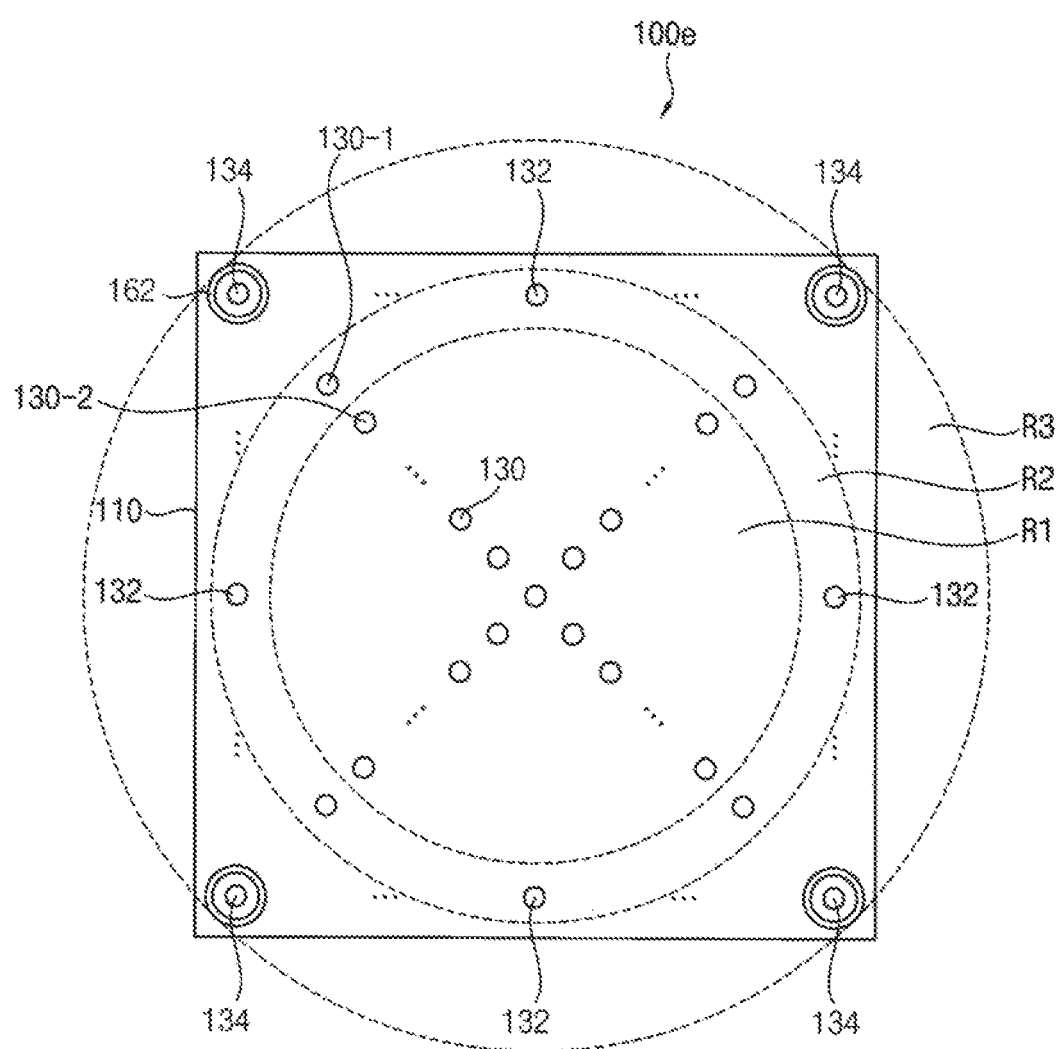
FIG. 16 is a plan view illustrating a package substrate in accordance with example embodiments.

FIG. 16 is a plan view illustrating a package substrate in accordance with example embodiments.

A package substrate 100*e* of this example embodiment may include elements substantially the same as those of the package substrate 100 in FIG. 1 except for a trench 162. Thus, the same reference numerals may refer to the same elements and any further illustrations with respect to the same elements may be omitted herein for brevity.

Referring to FIG. 16, the trench 162 may have an annular shape configured to fully surround the corner pad 134. The annular trench 162 may be formed from the upper surface of the insulation substrate 110 to the lower surface of the insulation substrate 110 or before the lower surface of the insulation substrate 110. The depth D3 of the trench 162 may be less than or equal to the depth D of the insulation substrate 110.

The shape and the position of the trench 162 may be substantially the same as those of the trench 150 in FIG. 1. Thus, any further illustrations with respect to the shape and the position of the trench 162 may be omitted herein for brevity.

Further, the structure of the trench 162 may be applied to the trench 152 in FIG. 8, and the first trench 156 and the second trench 154 in FIG. 11.

Figure 17:
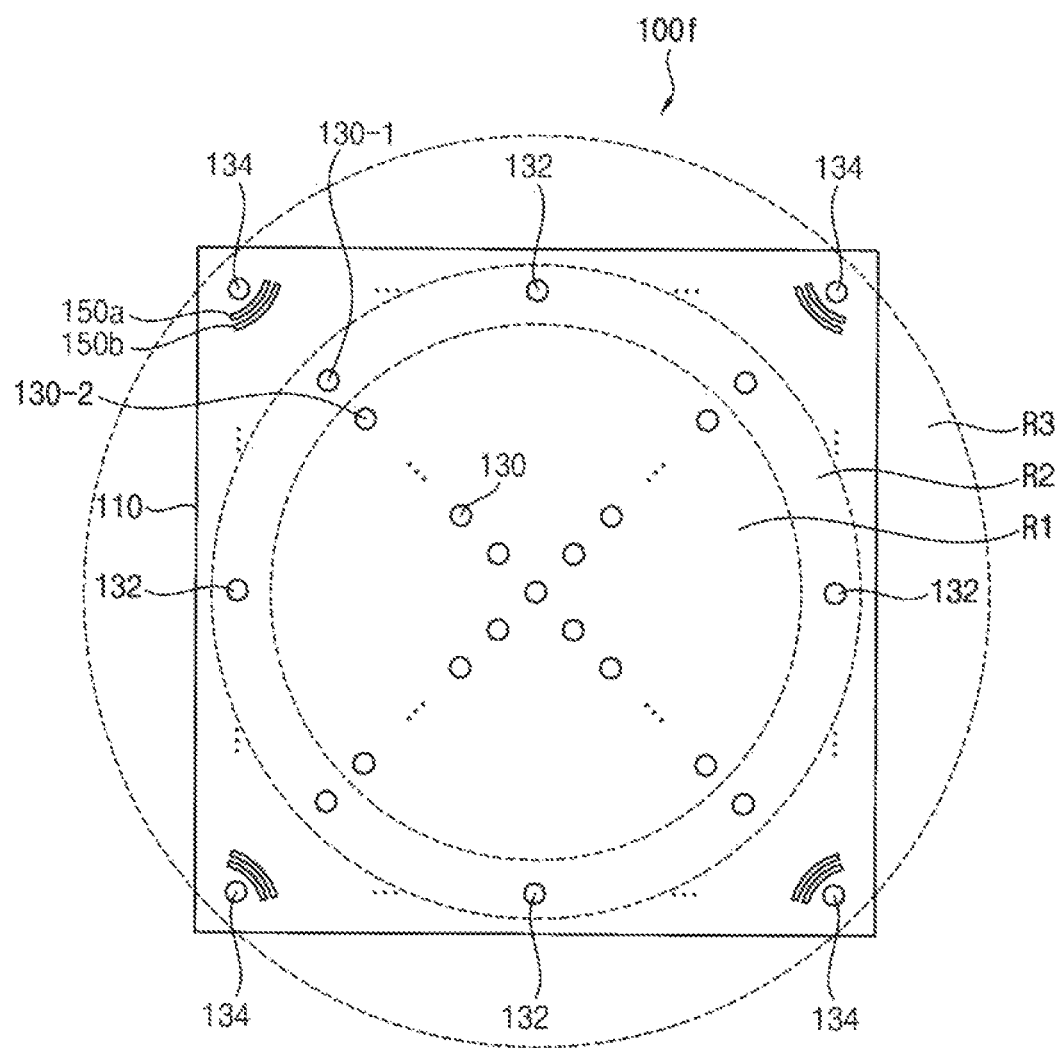
FIG. 17 is a plan view illustrating a package substrate in accordance with example embodiments.

FIG. 17 is a plan view illustrating a package substrate in accordance with example embodiments.

A package substrate 100*f* of this example embodiment may include elements substantially the same as those of the package substrate 100 in FIG. 1 except for a trench 150*a* and trench 150*b*. Thus, the same reference numerals may refer to the same elements and any further illustrations with respect to the same elements may be omitted herein for brevity.

Referring to FIG. 17, the trench of this example embodiment may include an inner trench 150*a* and an outer trench 150*b* with respect to the corner pad 134. The inner trench 150*a* and the outer trench 150*b* may be formed from the upper surface of the insulation substrate 110 to the lower surface of the insulation substrate 110 or before the lower surface of the insulation substrate 110. The depth D4 of each of the inner trench 150*a* and the outer trench 150*b* may be less than or equal to the depth D of the insulation substrate 110.

The shape and the position of the inner and outer trenches 150*a* and 150*b* may be substantially the same as those of the trench 150 in FIG. 1. That is, the trench including the inner trench 150*a* and the outer trench 150*b* may correspond to the trench 150 in FIG. 1 arranged in two rows. Thus, any further illustrations with respect to the shape and the position of the inner and outer trenches 150*a* and 150*b* may be omitted herein for brevity. However, embodiments are not limited thereto, and the trench of this example embodiment may be arranged in, for example, three rows.

Further, the structure of the inner and outer trenches 150*a* and 150*b* may be applied to the trench 152 in FIG. 8, and the first trench 156 and the second trench 154 in FIG. 11.

Figure 18:
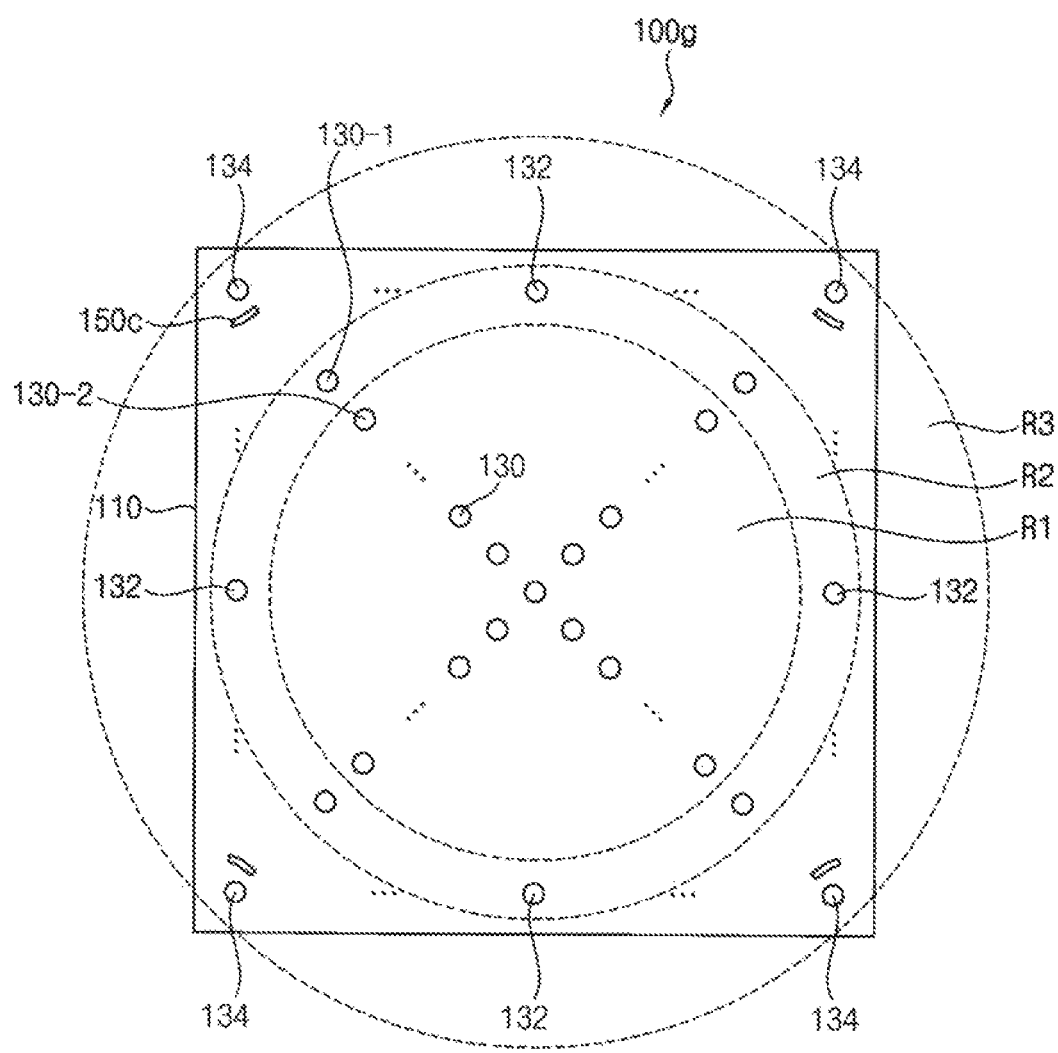
FIG. 18 is a plan view illustrating a package substrate in accordance with example embodiments.

FIG. 18 is a plan view illustrating a package substrate in accordance with example embodiments.

A package substrate 100*g* of this example embodiment may include elements substantially the same as those of the package substrate 100 in FIG. 1 except for a trench 150*c*. Thus, the same reference numerals may refer to the same elements and any further illustrations with respect to the same elements may be omitted herein for brevity.

Referring to FIG. 18, the trench 150*c* of this example embodiment may be positioned at any one of the both portions of the insulation substrate 110 with respect to the expansion direction. That is, the trench 150*c* may have a length of a half of length of the trench 150 in FIG. 1. The trench 150*c* may be formed from the upper surface of the insulation substrate 110 to the lower surface of the insulation substrate 110 or before the lower surface of the insulation substrate 110. The depth D5 of the trench 150*c* may be less than or equal to the depth D of the insulation substrate 110.

The shape and the position of the trench 150*c* may be substantially the same as those of the trench 150 in FIG. 1. Thus, any further illustrations with respect to the shape and the position of the trench 150*c* may be omitted herein for brevity.

Further, the structure of the trench 150*c* may be applied to the trench 152 in FIG. 8, and the first trench 156 and the second trench 154 in FIG. 11.

Figure 19:
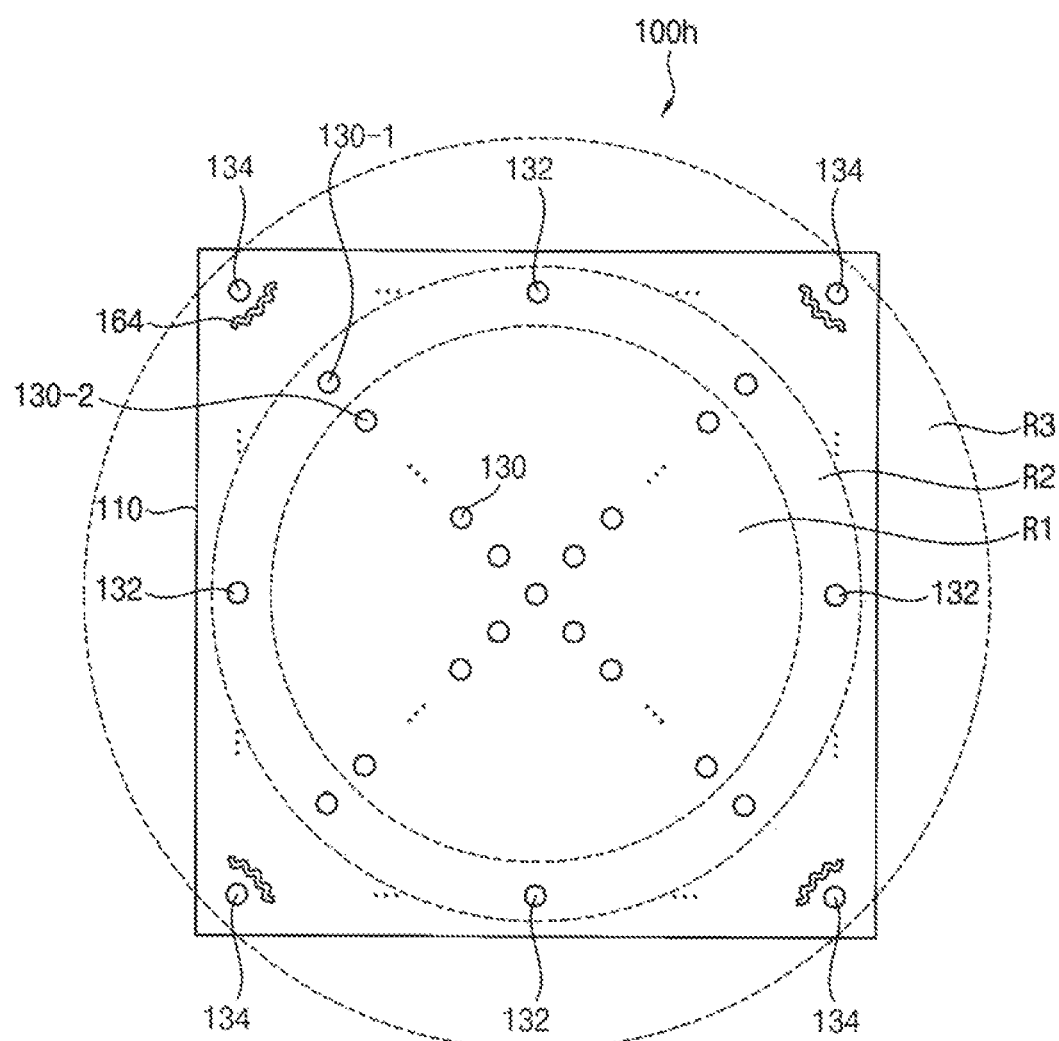
FIG. 19 is a plan view illustrating a package substrate in accordance with example embodiments.

FIG. 19 is a plan view illustrating a package substrate in accordance with example embodiments.

A package substrate 100*h* of this example embodiment may include elements substantially the same as those of the package substrate 100 in FIG. 1 except for a shape of a trench 164. Thus, the same reference numerals may refer to the same elements and any further illustrations with respect to the same elements may be omitted herein for brevity.

Referring to FIG. 19, the trench 164 of this example embodiment may have a zigzag shape configured to cross the expansion direction of the insulation substrate 110. The zigzag trench 164 may be formed from the upper surface of the insulation substrate 110 to the lower surface of the insulation substrate 110 or before the lower surface of the insulation substrate 110. The depth D6 of the trench 164 may be less than or equal to the depth D of the insulation substrate 110.

The shape and the position of the trench 164 may be substantially the same as those of the trench 150 in FIG. 1. Thus, any further illustrations with respect to the shape and the position of the trench 164 may be omitted herein for brevity.

Further, the structure of the trench 164 may be applied to the trench 152 in FIG. 8, and the first trench 156 and the second trench 154 in FIG. 11.

Figure 20:
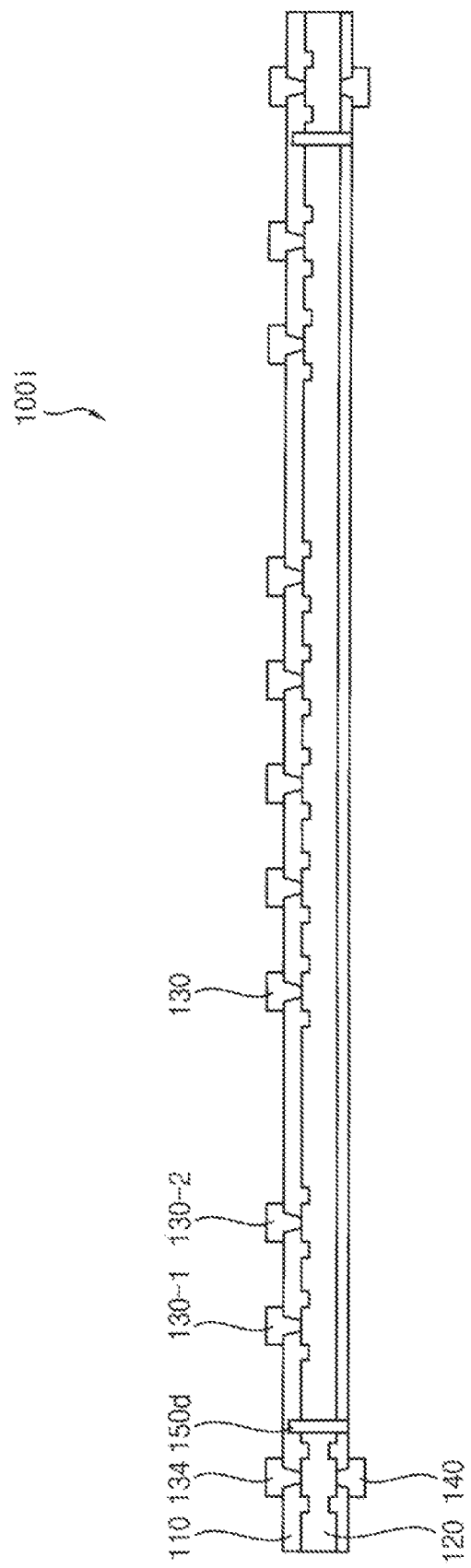
FIG. 20 is a plan view illustrating a package substrate in accordance with example embodiments.

FIG. 20 is a cross-sectional view illustrating a package substrate in accordance with example embodiments.

A package substrate 100*i* of this example embodiment may include elements substantially the same as those of the package substrate 100 in FIG. 1 except for a trench 150*d*. Thus, the same reference numerals may refer to the same elements and any further illustrations with respect to the same elements may be omitted herein for brevity.

Referring to FIG. 20, the trench 150*d* may be formed from the lower surface of the insulation substrate 110. The trench 150*d* may not be exposed through the upper surface of the insulation substrate 110. The depth D7 of the trench 150*d* may be less than the depth D of the insulation substrate 110.

The shape and the position of the trench 150*d* may be substantially the same as those of the trench 150 in FIG. 1. Thus, any further illustrations with respect to the shape and the position of the trench 150*d* may be omitted herein for brevity.

Further, the structure of the trench 150*d* may be applied to the trench 152 in FIG. 8, and the first trench 156 and the second trench 154 in FIG. 11.

Figure 21:
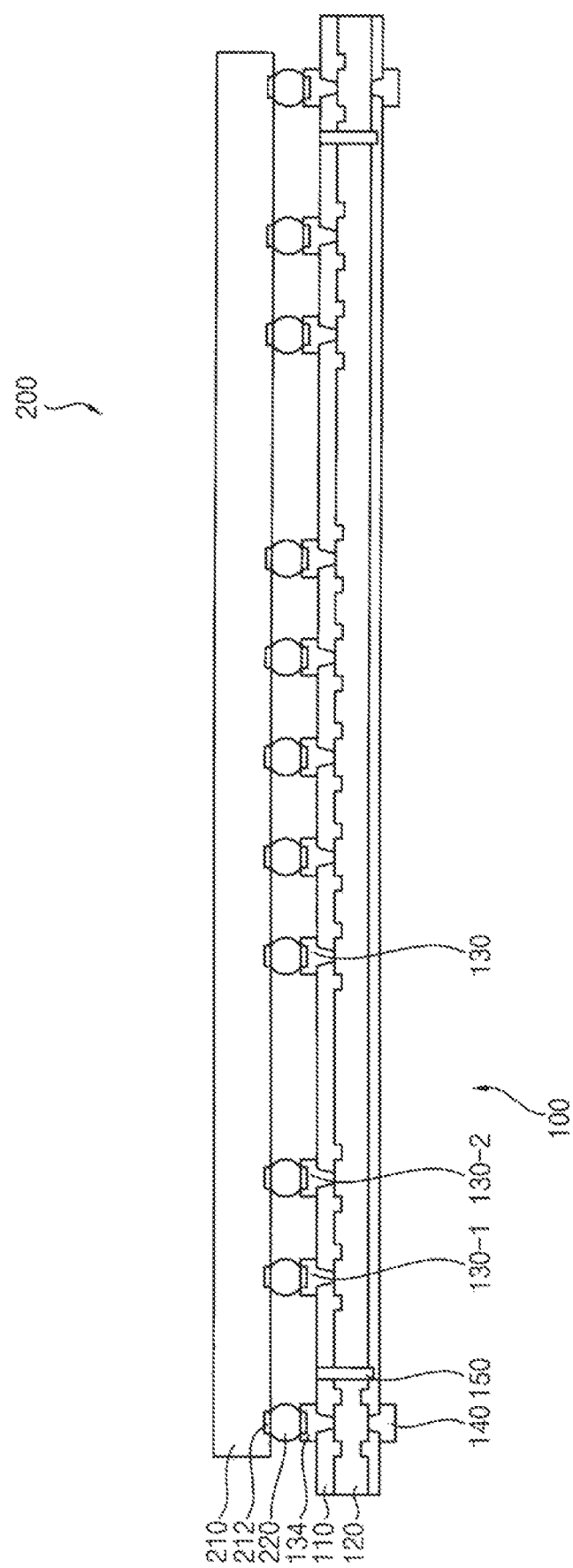
FIG. 21 is a cross-sectional view illustrating a semiconductor package including the package substrate in FIG. 2 in accordance with example embodiments.

FIG. 21 is a cross-sectional view illustrating a semiconductor package including the package substrate in FIG. 2 in accordance with example embodiments.

Referring to FIG. 21, a semiconductor package 200 of this example embodiment may include the package substrate 100, a semiconductor chip 210 and conductive bumps 220.

The package substrate 100 may have a structure substantially the same as that of the package substrate 100 in FIG. 2. Thus, any further illustrations with respect to the package substrate 100 may be omitted herein for brevity. The semiconductor package 200 may include the package substrate 100*a* in FIG. 8, the package substrate 100*b* in FIG. 11, the package substrate 100*c* in FIG. 14, the package substrate 100*d* in FIG. 15, the package substrate 100*e* in FIG. 16, the package substrate 100*f* in FIG. 17, the package substrate 100*g* in FIG. 18, the package substrate 100*h* in FIG. 19 or the package substrate 100*i* in FIG. 20.

The semiconductor chip 210 may be arranged over the package substrate 100. Bump pads 212 may be arranged on a lower surface of the semiconductor chip 210. The conductive bumps 220 may be interposed between the semiconductor chip 210 and the package substrate 100. For example, the conductive bumps 220 may be interposed between the bump pads 212 of the semiconductor chip 210 and the upper pads 130, 132, and 134 of the package substrate 100 to electrically connect the bumps pad 212 with the upper pads 130, 132, and 134.

As mentioned above, because the trench 150 may block the stress spreading in the expansion direction, the application of the stress to the corners of the insulation substrate 110 may be prevented or reduced. As a result, the generations of the cracks in the conductive bumps 220 on the corner pads 134 and the BEOL of the semiconductor chip 210 may also be prevented or reduced.

Figure 22:
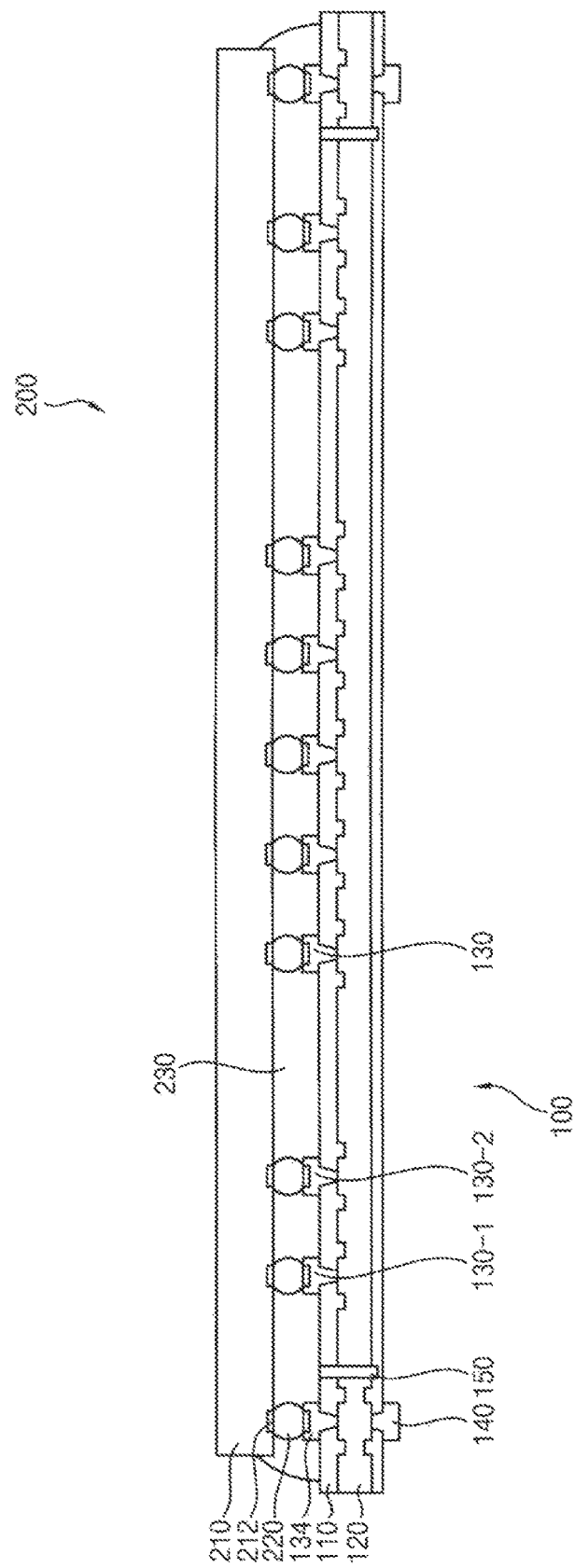
FIG. 22 is a cross-sectional view illustrating a semiconductor package including the package substrate in FIG. 2 in accordance with example embodiments.

FIG. 22 is a cross-sectional view illustrating a semiconductor package including the package substrate in FIG. 2 in accordance with example embodiments.

A semiconductor package 200*a* of this example embodiment may include elements substantially the same as those of the semiconductor package 200 in FIG. 21 except for further including an underfilling layer. Thus, the same reference numerals may refer to the same elements and any further illustrations with respect to the same elements may be omitted herein for brevity.

Referring to FIG. 22, the underfilling layer 230 may be formed in a space between the semiconductor chip 210 and the package substrate 100. The trench 150 may be filled with the underfilling layer 230.

In example embodiments, the underfilling layer 230 may include a material having a CTE lower than the CTE of the insulation substrate 110. Thus, the underfilling layer 230 in the trench 150 may prevent or reduce the spreading of the stress in the expansion direction.

The package substrates of example embodiments may be applied to other semiconductor packages having the conductive bumps as an electrical connection. For example, the package substrates of example embodiments may be applied to a package on package (POP) package, a multi-chip package, a wafer level package, etc.

According to example embodiments, a trench may be formed at the portion of the insulation substrate adjacent to the at least one of the upper pads in the direction crossing the expansion direction to block the spread of the stress, which may be generated by the expansion and the contraction of the insulation substrate, to the at least one upper pad. For example, the corner pads positioned at the corners of the insulation substrate to which a relatively high stress among the stresses may be applied may be surrounded by the trenches to prevent or reduce cracks from being generated in the conductive bumps and the BEOL of the semiconductor chip connected to the conductive bumps.

The foregoing is illustrative of example embodiments and is not to be construed as limiting thereof. Although example embodiments have been described, those skilled in the art will readily appreciate that many modifications are possible in the example embodiments without materially departing from the novel teachings and advantages of the present disclosure. Accordingly, all such modifications are intended to be included within the scope as defined in the claims.

What is claimed is:

1. A package substrate comprising:
   an insulation substrate;
   a conductive layer provided in the insulation substrate;
   upper pads provided on an upper surface of the insulation substrate and electrically connected to the conductive layer;
   lower pads provided on a lower surface of the insulation substrate and electrically connected to the conductive layer; and
   at least one trench provided at a portion of the insulation substrate adjacent to at least one of the upper pads and configured to block stress, which is generated by an expansion of the insulation substrate, from spreading to the at least one of the upper pads,
   wherein the at least one trench is provided in a direction crossing a direction from a central portion of the insulation substrate to a corner of the insulation substrate.

2. The package substrate of 1, wherein the upper pads comprise corner pads provided at corners of the insulation substrate, and
   wherein the at least one trench partially surrounds each of the corner pads.

3. The package substrate of claim 1, wherein the upper pads comprise edge pads provided at an edge portion of the insulation substrate, the edge portion of the insulation substrate being provided between corners of the insulation substrate and the central portion of the insulation substrate, and wherein the at least one trench partially surrounds each of the edge pads.

4. The package substrate of claim 1, wherein the at least one trench comprises:
- a first trench partially surrounding a first pad among the upper pads provided in a first region, the first region being defined by a first radius from a center of the insulation substrate, and the first trench having a first width;
- a second trench partially surrounding a second pad among the upper pads in a second region, the second region being defined by a second radius longer than the first radius from the center of the insulation substrate to surround the first region, and the second trench having a second width wider than the first width; and
- a third trench partially surrounding a third pad among the upper pads in a third region, the third region being defined by a third radius longer than the second radius from the center of the insulation substrate to surround the second region, and the third trench having a third width wider than the second width.

5. The package substrate of claim 1, wherein a depth of the at least one trench is less than a depth of the insulation substrate.

6. The package substrate of claim 5, wherein the depth of the at least one trench is greater than or equal to 5% of the depth of the insulation substrate.

7. The package substrate of claim 1, wherein a depth of the at least one trench is equal to a depth of the insulation substrate.

8. The package substrate of claim 1, wherein the at least one trench is provided on at least one of the upper surface of the insulation substrate and the lower surface of the insulation substrate.

9. A package substrate comprising:
- an insulation substrate;
- a conductive layer provided in the insulation substrate;
- upper pads provided on an upper surface of the insulation substrate and electrically connected to the conductive layer;
- lower pads provided on a lower surface of the insulation substrate and electrically connected to the conductive layer; and
- trenches provided at portions of the insulation substrate adjacent to corner pads among the upper pads, the corner pads being provided at corners of the insulation substrate in a direction crossing a direction from a central portion of the insulation substrate to the corners of the insulation substrate, a depth of each of the trenches being from 5% to 100% of a depth of the insulation substrate.

10. The package substrate of claim 9, wherein each of the trenches partially surrounds each of the corner pads, respectively.

11. The package substrate of claim 9, wherein a depth of each of the trenches is less than a depth of the insulation substrate.

12. The package substrate of claim 9, wherein the trenches is provided on at least one of the upper surface of the insulation substrate and the lower surface of the insulation substrate.

13. A semiconductor package comprising:
- a semiconductor chip comprising bump pads;
- conductive bumps connected to the bump pads, respectively; and
- a package substrate comprising:
  - an insulation substrate provided under the semiconductor chip,
  - a conductive layer provided in the insulation substrate,
  - upper pads provided on an upper surface of the insulation substrate and electrically connecting the conductive layer with the conductive bumps,
  - lower pads provided on a lower surface of the insulation substrate and electrically connected to the conductive layer, and
  - at least one trench provided at a portion of the insulation substrate adjacent to at least one of the upper pads to block stress, which is generated by an expansion of the insulation substrate, from spreading to the at least one of the upper pads,
- wherein the at least one trench is provided in a direction crossing a direction from a central portion of the insulation substrate to a corner of the insulation substrate.

14. The semiconductor package of claim 13, wherein the at least one trench partially surrounds each of corner pads provided at each of a corners of the insulation substrate.

15. The semiconductor package of claim 13, further comprising an underfilling layer provided between the semiconductor chip and the package substrate and filling the at least one trench,
wherein the underfilling layer has a coefficient of thermal expansion (CTE) lower than a CTE of the package substrate.

* * * * *